United States Patent
Rhodes et al.

(10) Patent No.: US 10,299,395 B2
(45) Date of Patent: May 21, 2019

(54) ELECTRICAL DEVICE WITH NUT RETENTION SLOT

(71) Applicant: TE CONNECTIVITY CORPORATION, Berwyn, PA (US)

(72) Inventors: Clara Marguerite Rhodes, Harrisburg, PA (US); David Charles Strausser, Winston-Salem, NC (US)

(73) Assignee: TE Connnectivity Corporation, Berwyn, PA (US)

( * ) Notice: Subject to any disclaimer, the term of this patent is extended or adjusted under 35 U.S.C. 154(b) by 0 days.

(21) Appl. No.: 15/658,024

(22) Filed: Jul. 24, 2017

(65) Prior Publication Data

US 2019/0029134 A1    Jan. 24, 2019

(51) Int. Cl.
| | |
|---|---|
| *H05K 5/02* | (2006.01) |
| *F16B 5/02* | (2006.01) |
| *F16B 41/00* | (2006.01) |
| *F16B 33/00* | (2006.01) |
| *H05K 5/00* | (2006.01) |

(52) U.S. Cl.
CPC ......... *H05K 5/0217* (2013.01); *F16B 5/0258* (2013.01); *F16B 33/002* (2013.01); *F16B 41/002* (2013.01); *H05K 5/0008* (2013.01); *H05K 5/0204* (2013.01)

(58) Field of Classification Search
CPC .................................................... H01R 12/716
USPC .......................................................... 174/520
See application file for complete search history.

(56) References Cited

U.S. PATENT DOCUMENTS

| | | | | |
|---|---|---|---|---|
| 4,099,274 A | * | 7/1978 | Emberson | E03F 5/0407 4/286 |
| 4,193,435 A | | 3/1980 | Charles et al. | |
| 4,676,706 A | * | 6/1987 | Inaba | F16B 37/041 411/175 |
| 5,340,123 A | * | 8/1994 | Griffiths | F16L 5/08 277/606 |
| 5,340,162 A | * | 8/1994 | Prendel | F16L 19/0225 285/110 |

(Continued)

FOREIGN PATENT DOCUMENTS

| | | |
|---|---|---|
| JP | S5239969 U | 3/1977 |
| JP | S55165116 U | 11/1980 |

(Continued)

OTHER PUBLICATIONS

European Search Report, European Application No. 18185162.7-1019, International Filing Date Dec. 13, 2018.

*Primary Examiner* — Stanley Tso

(74) *Attorney, Agent, or Firm* — Snell & Wilmer L.L.P.

(57) ABSTRACT

An electrical device includes a housing with a flange. The flange has a top side, an opposite bottom side, and an outer side extending between the top and bottom sides. The flange defines a bolt aperture extending from the bottom side towards the top side. The flange includes a nut retention slot within the flange. The nut retention slot has a size and shape configured to receive a nut therein through an opening along the outer side of the flange. The bolt aperture is positioned relative to the nut retention slot to align with a threaded central bore of the nut disposed within the nut retention slot to allow insertion of a bolt through the bolt aperture into the threaded central bore of the nut.

18 Claims, 3 Drawing Sheets

(56) References Cited

U.S. PATENT DOCUMENTS

| | | | | |
|---|---|---|---|---|
| 6,027,293 | A * | 2/2000 | Beemer | F16B 37/044 |
| | | | | 411/112 |
| 8,092,115 | B1 * | 1/2012 | McLeod | H04Q 1/02 |
| | | | | 312/223.2 |
| 8,727,684 | B1 * | 5/2014 | Woods | F16B 39/284 |
| | | | | 411/192 |
| 2002/0096419 | A1 * | 7/2002 | Konda | H01H 9/085 |
| | | | | 200/17 R |
| 2005/0081875 | A1 * | 4/2005 | Wang | A01K 13/002 |
| | | | | 132/219 |
| 2006/0086878 | A1 * | 4/2006 | Cormier | G09F 7/18 |
| | | | | 248/314 |
| 2011/0024428 | A1 * | 2/2011 | Dunn | E03B 7/07 |
| | | | | 220/327 |
| 2012/0328390 | A1 * | 12/2012 | Colpan | F25B 39/04 |
| | | | | 411/166 |
| 2014/0192457 | A1 * | 7/2014 | Zhao | B60R 16/0238 |
| | | | | 361/624 |
| 2016/0351868 | A1 * | 12/2016 | Eom | H01M 2/1022 |

FOREIGN PATENT DOCUMENTS

| | | |
|---|---|---|
| JP | H1132411 A | 2/1999 |
| KR | 20090006790 U | 7/2009 |

\* cited by examiner

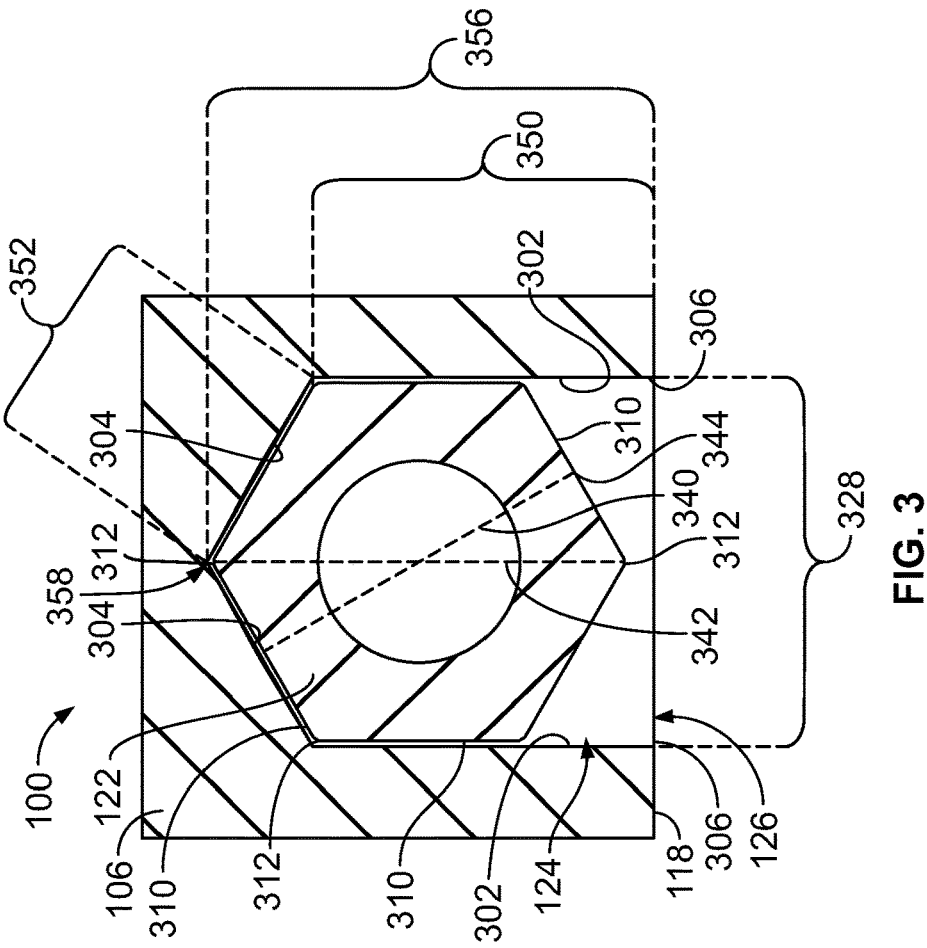
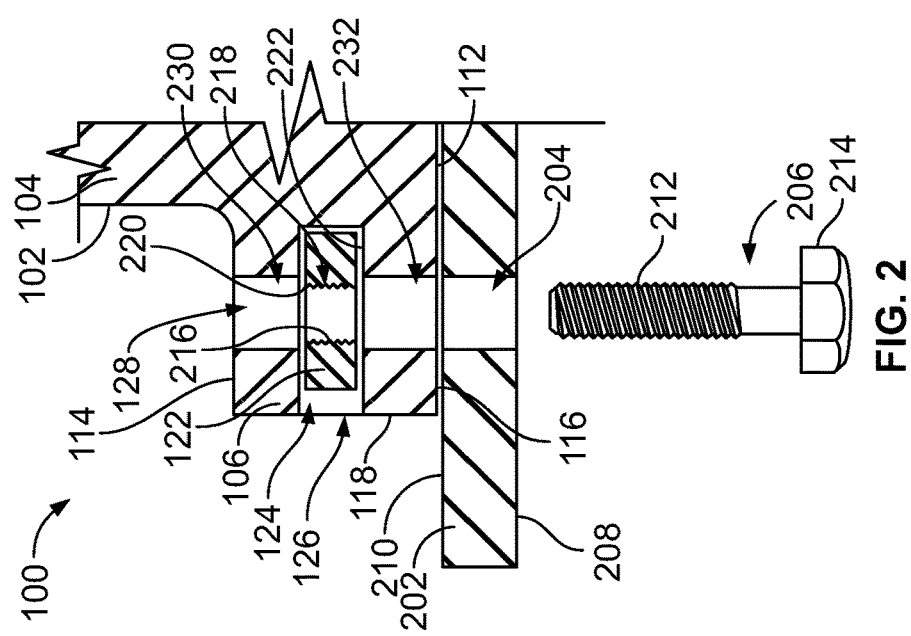

ELECTRICAL DEVICE WITH NUT RETENTION SLOT

BACKGROUND OF THE INVENTION

The subject matter herein relates generally to electrical devices that are configured to be mounted to a wall or panel.

Electrical devices are commonly mounted to walls, tables, cases, and the like, via the use of bolts and nuts. For example, the electrical device may be placed against a flat panel, a bolt is inserted through aligned openings in the device and the panel, and bolt is threadably connected to a nut. As a result, a portion of the electrical device and the panel are sandwiched between the nut and a head of the bolt.

Typical nut-and-bolt mounting of electrical devices to panels has several drawbacks. For example, to tighten the nut-and-bolt assembly, usually two different wrenches must be used, with one wrench engaging the nut and the other wrench engaging the head of the bolt to ensure rotation of the bolt relative to the nut. But, it may be difficult for a person mounting the electrical device to access and operate two different wrenches that are on opposite sides of the panel. Furthermore, due to vibration, tension, material expansion and contraction, and other stresses, the nut risks loosening relative to the bolt over time. Conventional devices use separate nut retaining components to lock the nut in place relative to the bolt, such as lock washers, spring washers, cotter pins, secondary jam nuts, interference collars, straps, and the like. But, these separate nut retaining components increase costs as a result of extra parts costs and assembly costs. In addition, since the panel and a portion of the electrical device are sandwiched between the nut and the head of the bolt, the nut and/or the head of the bolt may be visible on the surface of the electrical device, which could be considered aesthetically undesirable.

A need remains for a mountable electrical device that provides efficient, cost-effective nut retention.

BRIEF DESCRIPTION OF THE INVENTION

In an embodiment, an electrical device is provided that includes a housing having a flange. The flange has a top side, an opposite bottom side, and an outer side extending between the top side and the bottom side. The flange defines a bolt aperture extending from the bottom side towards the top side. The flange includes a nut retention slot within the flange. The nut retention slot has a size and shape configured to receive a nut therein through an opening along the outer side of the flange. The bolt aperture is positioned relative to the nut retention slot to align with a threaded central bore of the nut disposed within the nut retention slot to allow insertion of a bolt through the bolt aperture into the threaded central bore of the nut.

In an embodiment, an electrical device is provided that includes a housing. The housing includes a flange having a top side and an opposite bottom side. The flange defines a bolt aperture extending from the bottom side towards the top side. The flange includes a nut retention slot within the flange. The nut retention slot within the flange has a size and shape configured to receive a nut therein. The bolt aperture is positioned relative to the nut retention slot to align with a threaded central bore of the nut disposed within the nut retention slot to allow insertion of a bolt through the bolt aperture into the threaded central bore of the nut. The nut retention slot is defined between two opposing side walls that each includes a respective crush rib. The crush ribs protrude from the side walls into the nut retention slot. The crush ribs are configured to engage exterior sides of the nut that is received within the nut retention slot to retain the nut in the nut retention slot via an interference fit.

In an embodiment, an electrical device is provided that includes a housing and a nut. The housing includes a flange having a top side, an opposite bottom side, and an outer side extending between the top side and the bottom side. The flange defines a bolt aperture extending from the bottom side towards the top side. The flange includes a nut retention slot within the flange that is aligned with the bolt aperture. The nut retention slot is defined between two opposing side walls that each extends from the opening. Each of the side walls includes a respective crush rib protruding from the corresponding side wall into the nut retention slot. The nut is received within the nut retention slot through the opening in the outer side of the flange. The nut is retained within the nut retention slot via an interference fit between the crush ribs and exterior sides of the nut. The nut includes a threaded central bore that aligns with the bolt aperture to allow insertion of a bolt through the bolt aperture into the threaded central bore of the nut.

BRIEF DESCRIPTION OF THE DRAWINGS

FIG. 2 is a cross-sectional side view of a portion of the electrical device poised for mounting to a panel according to an embodiment.

FIG. 3 is a top-down cross-sectional view of a flange of the electrical device showing a nut within a corresponding nut retention slot of the flange according to an embodiment.

DETAILED DESCRIPTION OF THE INVENTION

Figure 1:
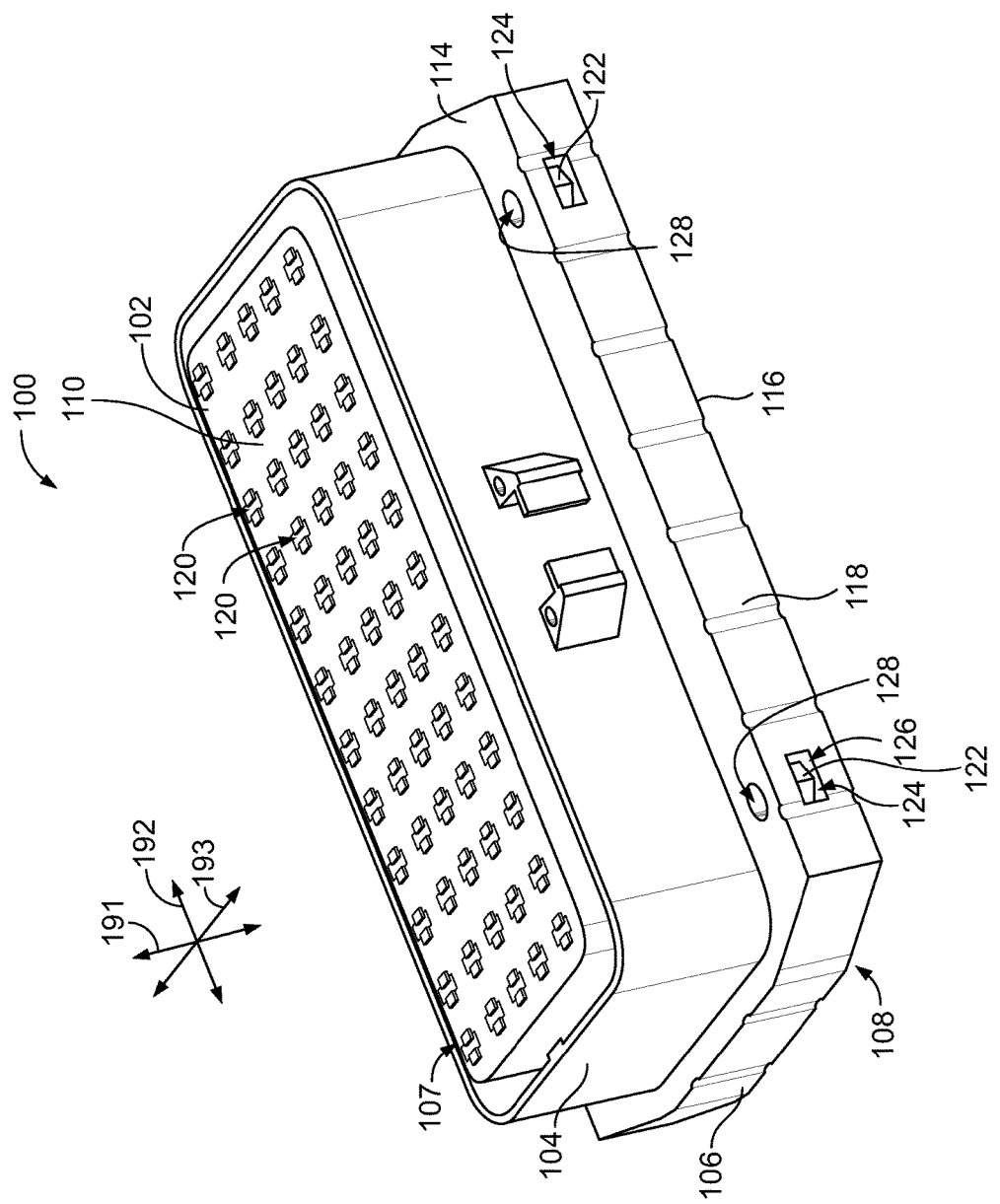
FIG. 1 is a front perspective view of an electrical device formed in accordance with an embodiment.

FIG. 1 is a front perspective view of an electrical device 100 formed in accordance with an embodiment. The electrical device 100 is configured to be mounted to a panel, such as a wall, a table, a case, or the like. The electrical device 100 includes a housing 102. The housing 102 is oriented with respect to a vertical axis 191, a longitudinal axis 192, and a lateral or depth axis 193. The axes 191-193 are mutually perpendicular. It is understood that the axes 191-193 are not required to have any particular orientation with respect to gravity and/or the surrounding environment of the housing 102.

The housing 102 has a base 104 and a mounting flange 106 extending outward from the base 104. The housing 102 extends a height along the vertical axis 191 between a top end 107 and an opposite bottom end 108. The bottom end 108 of the housing 102 defines a mounting end that faces the panel when mounted. The base 104 extends the height of the housing 102. The base 104 has a top face 110 at the top end 107 and a bottom face 112 (shown in FIG. 2) at the bottom end 108. As used herein, relative or spatial terms such as "top," "bottom," "front," "rear," "upper," and "lower" are only used to distinguish the referenced elements of the electrical device 100 and do not require particular positions or orientations relative to gravity and/or the surrounding environment of the electrical device 100. For example, the top end 107 could be below the bottom end 108 relative to gravity if the electrical device 100 is flipped 180 degrees for mounting to the underside of a table or a ceiling.

Although not visible in FIG. 1, the electrical device 100 may include one or more electrical components held within the housing 102. Non-limiting examples of electrical components that may be held within the housing 102 include electrical conductors, circuit boards, microprocessors, capacitors, transistors, batteries, and the like. In the illustrated embodiment, the electrical device 100 is an electrical fuse and/or relay box, and the housing 102 includes an array of channels 120 that extend through the base 104 between the top face 110 and the bottom face 112. The channels 120 hold electrical fuse and/or relay conductors (not shown) therein. In one or more alternative embodiments, the electrical device 100 may be other types of mountable electrical devices other than a fuse and/or relay box, such as a panel-mounted electrical header connector, a wireless router, a thermostat, a display device, or the like.

The mounting flange 106 (referred to herein as flange 106) is used for mounting the housing 102 to the panel. The flange 106 is located at the bottom end 108 of the housing 102. The flange 106 has a top side 114 and an opposite bottom side 116. In an embodiment, the bottom side 116 of the flange 106 is flush with the bottom face 112 of the base 104. The flange 106 is shorter than the base 104, such that the top side 114 of the flange 106 is recessed from the top face 110 of the base 104. The flange 106 extends outward from the base 104 to an outer side 118 of the flange 106. The outer side 118 extends between the top and bottom sides 114, 116, and represents a perimeter of the flange 106.

The electrical device 100 includes multiple nuts 122 retained within the flange 106 and used for mounting the electrical device 100 to the panel. The nuts 122 are held in nut retention slots 124 of the flange 106. The nut retention slots 124 each have a size and shape configured to receive a single nut 122. The nut retention slots 124 are open along the outer side 118 of the flange 106. The nuts 122 are inserted into the nut retention slots 124 through openings 126 along the outer side 118. Two nut retention slots 124 are shown in FIG. 1, but the electrical device 100 may have more than two nut retention slots 124 in other embodiments. The flange 106 also defines multiple bolt apertures 128 that are configured to receive bolts through for mounting the electrical device 100. The bolt apertures 128 extend vertically through the flange 106 between the top side 114 and the bottom side 116. Each of the nut retention slots 124 aligns with one of the corresponding bolt apertures 128. Therefore, the bolt that is received into one of the bolt apertures 128 is configured to engage and fasten to the nut 122 within the nut retention slot 124 that aligns with that bolt aperture 128.

FIG. 2 is a cross-sectional side view of a portion of the electrical device 100 poised for mounting to a panel 202 according to an embodiment. The illustrated portion of the electrical device 100 shows one of the nuts 122 held in the corresponding nut retention slot 124. The housing 102 is placed against the panel 202 such that the bottom side 116 of the flange 106 and the bottom face 112 of the base 104 engage a top side 210 of the panel 202. The bolt aperture 128 associated with the nut retention slot 124 is positioned relative to the nut retention slot 124 such that the bolt aperture 128 aligns with a central bore 218 of the nut 122. The nut retention slot 124 and the bolt aperture 128 are aligned with a mounting hole 204 in the panel 202. A bolt fastener 206 is located below a bottom side 208 of the panel 202. The bolt fastener 206 includes a threaded shank 212 and a head 214.

To mount the electrical device 100 to the panel 202, the threaded shank 212 is inserted through the mounting hole 204 into the bolt aperture 128 and engages the nut 122 held within the nut retention slot 124. The threaded shank 212 engages threads 216 within the central bore 218 of the nut 122. The head 214 of the bolt fastener 206 is rotated, such as by hand or a wrench, to couple the bolt fastener 206 to the nut 122 via the engagement of the threaded shank 212 with the threads 216 of the nut 122. The head 214 engages the bottom side 208 of the panel 202, which secures a portion of the flange 106 to the panel 202 between the head 214 and the nut 122, mounting the electrical device 100 to the panel 202.

The nut retention slot 124 has a height along the vertical axis 191 (shown in FIG. 1) defined between an upper interior surface 220 of the flange 106 and an opposite lower interior surface 222 of the flange 106. For example, the height of the nut retention slot 124 is slightly taller than a height of the nut 122 when the nut 122 is in a horizontal orientation as shown in FIG. 2. The upper and lower interior surfaces 220, 222 restrict vertical movement of the nut 122 within the slot 124. Due to the upper and lower interior surfaces 220, 222, the nut 122 can only enter the nut retention slot 124 through the opening 126 in the outer side 118 of the flange 106. In an embodiment, the nut retention slot 124 is spaced apart vertically from each of the top side 114 and the bottom side 116 of the flange 106. The bolt aperture 128 extends through the upper and lower interior surfaces 220, 222 of the nut retention slot 124. For example, the bolt aperture 128 has a first portion 230 that extends between the upper interior surface 220 and the top side 114 of the flange 106, and a second portion 232 that extends between the bottom side 116 of the flange 106 and the lower interior surface 222. In the illustrated embodiment, the first portion 230 extends fully to the top side 114 of the flange 106, such that the bolt aperture 128 is open along the top side 114. In an alternative embodiment, the first portion 230 does not extend fully to the top side 114, so the bolt aperture 128 is not exposed along the top side 114 of the flange 106.

The bolt aperture 128 has a diameter that is larger than a diameter of the threaded central bore 218 of the nut 122 within the nut retention slot 124. Therefore, the threaded shank 212 can be inserted cleanly through the bolt aperture 128 of the flange 106, and only couples to the threads 216 of the nut 122. The diameter of the bolt aperture 128 is less than an outer diameter of the nut 122 (and less than the size of the nut retention slot 124), so the nut 122 cannot fall out of the nut retention slot 124 into the bolt aperture 128.

FIG. 3 is a top-down cross-sectional view of the flange 106 of the electrical device 100 showing one of the nuts 122 within a corresponding nut retention slot 124 according to an embodiment. The nut retention slot 124 has a perimeter defined by the opening 126 along the outer side 118 of the flange 106, two opposing side walls 302 that extend from the opening 126, and two angled back walls 304 disposed between the side walls 302 and across from the opening 126. The nut retention slot 124 in the illustrated embodiment has a pentagonal cross-sectional shape. The side walls 302 extend laterally (e.g., along the lateral axis 193 shown in FIG. 1) into the flange 106 from opposite sides 306 of the opening 126. The width 328 of the nut retention slot 124 is defined between the side walls 302 and extends longitudinally. The width 328 is equal to a width of the opening 126 in the illustrated embodiment.

The number and lengths of the back walls 304, as well as the angle between the back walls 304, is to accommodate the shape of the nut 122. For example, the nut retention slot 124 in the illustrated embodiment is configured to receive a hexagonal nut 122 having six linear exterior sides 310 and six corners 312 located at intersections between the exterior sides 310. The slot 124 has two angled back walls 304 to accommodate two adjacent exterior sides 310 and one corner 312 of the nut 122. For example, an angle between the two back walls 304 may be approximately equal to the angle at the corners 312 of the nut 122. The slot 124 may have other cross-sectional shapes and different numbers of back walls 304 in other embodiments in order to accommodate different types of nuts 122. For example, the nut retention slot 124 in one alternative embodiment may have a single back wall that extends between the two side walls 302, defining a quadrilateral perimeter, to accommodate a square nut. In another alternative embodiment, the nut retention slot 124 has three back walls, and a hexagonal perimeter, to accommodate an octagonal nut.

The side walls 302 of the nut retention slot 124 extend parallel to each other. In the illustrated embodiment, the side walls 302 are perpendicular to a plane of the opening 126 (e.g., perpendicular to the plane of the outer side 118 of the flange 106). Alternatively, the side walls 302 may extend at a transverse angle relative to the plane of the opening 126 that is other than 90 degrees.

Since the perimeter of the nut 122 is defined by linear segments, the nut 122 has a range of outer diameters between a minimum outer diameter 340 and a maximum outer diameter 342. The minimum outer diameter 340 is defined between the midpoints 344 of opposite exterior sides 310 of the nut 122. The maximum outer diameter 342 is defined between opposite corners 312 of the nut 122. The width 328 of the nut retention slot 124 (between the two side walls 302) is greater than the minimum outer diameter 340 and less than the maximum outer diameter 342. The size of the nut retention slot 124 is therefore large enough to accommodate the nut 122, but also prevents full rotation of the nut 122 therein. For example, when a torque is applied on the nut 122 from the threaded shank 212 of the bolt 206 (shown in FIG. 2), the side walls 302 of the slot 124 abut against corresponding exterior sides 310 of the nut 122 to block rotation of the nut 122 beyond a threshold amount of rotation within clearance gaps between the exterior sides 310 and the side walls 302. Since the side walls 302 of the nut retention slot 124 block rotation of the nut 122, the nut retention slot 124 inherently functions as a wrench. Therefore, during the mounting process, the operator actuates the bolt fastener 206 alone. The operator does not need to also engage the nut 122 to allow for relative rotation between the bolt 206 and the nut 122.

The side walls 302 of the nut retention slot 124 have lengths 350 that extend laterally from the opening 126 at the outer side 118 to the back walls 304. In the illustrated embodiment, the lengths 350 of the side walls 302 are greater than lengths 352 of the back walls 304 and the lengths of the exterior sides 310 of the nut 122. In an embodiment, an entirety of the nut 122 is disposed within the flange 106 interior of the outer side 118. For example, when the nut 122 is fully loaded in the slot 124, no portion of the nut 122 protrudes out of the flange 106 through the opening 126. The nut retention slot 124 extends a depth 356 into the flange 106 from the opening 126 to an innermost end 358 of the nut retention slot 124, which is the point of the slot 124 farthest from the opening 126. The depth 356 is greater than the maximum outer diameter 342 of the nut 122.

Figure 4:
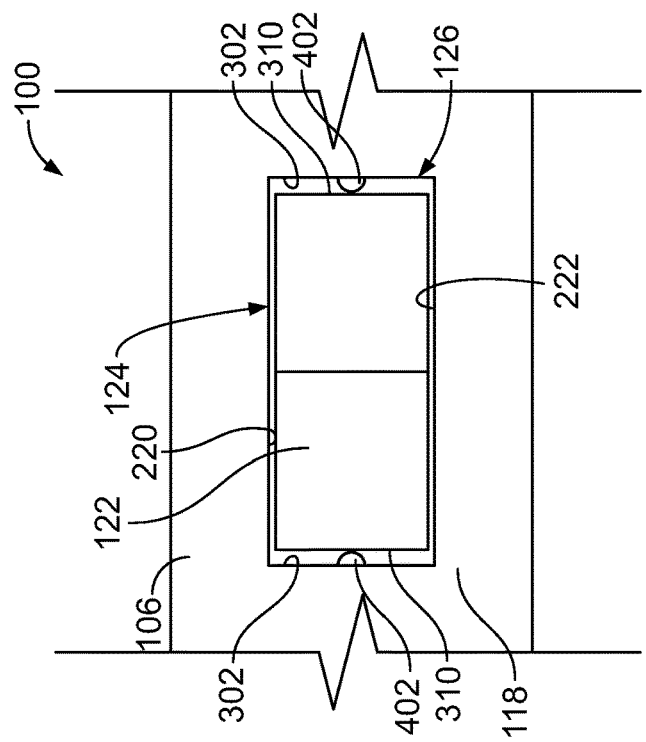
FIG. 4 is a side view of a portion of the electrical device showing the nut in one of the nut retention slots according to an embodiment.

FIG. 4 is a side view of a portion of the electrical device 100 showing a nut 122 in one of the nut retention slots 124 according to an embodiment. The side view shows the nut 122 through the opening 126 in the outer side 118 of the flange 106. The nut 122 is held in the slot 124 longitudinally between the side walls 302 and vertically between the upper and lower interior surfaces 220, 222. In an embodiment, the side walls 302 each include a respective crush rib 402. The crush ribs 402 protrude from the side walls 302 into the nut retention slot 124. The crush ribs 402 engage the exterior sides 310 of the nut 122 to retain the nut 122 within the nut retention slot 124 via an interference fit. For example, the crush ribs 402 are deformable (or compressible). When the nut 122 is inserted into the slot 124 through the opening 126, the sides 310 of the nut 122 engage and deform the crush ribs 402. The nut 122 within the slot 124 is sandwiched between the opposing crush ribs 402, and the interference prevents the nut 122 from unintentionally exiting the slot 124 through the opening 126. In an alternative embodiment, only one of the two side walls 302 includes a crush rib 402 instead of both side walls 302. In such an alternative embodiment, the nut 122 is sandwiched between the one crush rib 402 and the opposing side wall 302.

The crush ribs 402 are composed of a dielectric polymer material, such as a plastic material. In an embodiment, the crush ribs 402 are integral to the side walls 302. For example, the flange 106 may be composed of a dielectric polymer material, and the crush ribs 402 are formed integral to the side walls 302 in a common manufacturing process, such as an injection molding process. In the illustrated embodiment, each of the side walls 302 includes a single crush rib 402, but the side walls 302 optionally may include more than one crush rib 402 in other embodiments.

Figure 5:
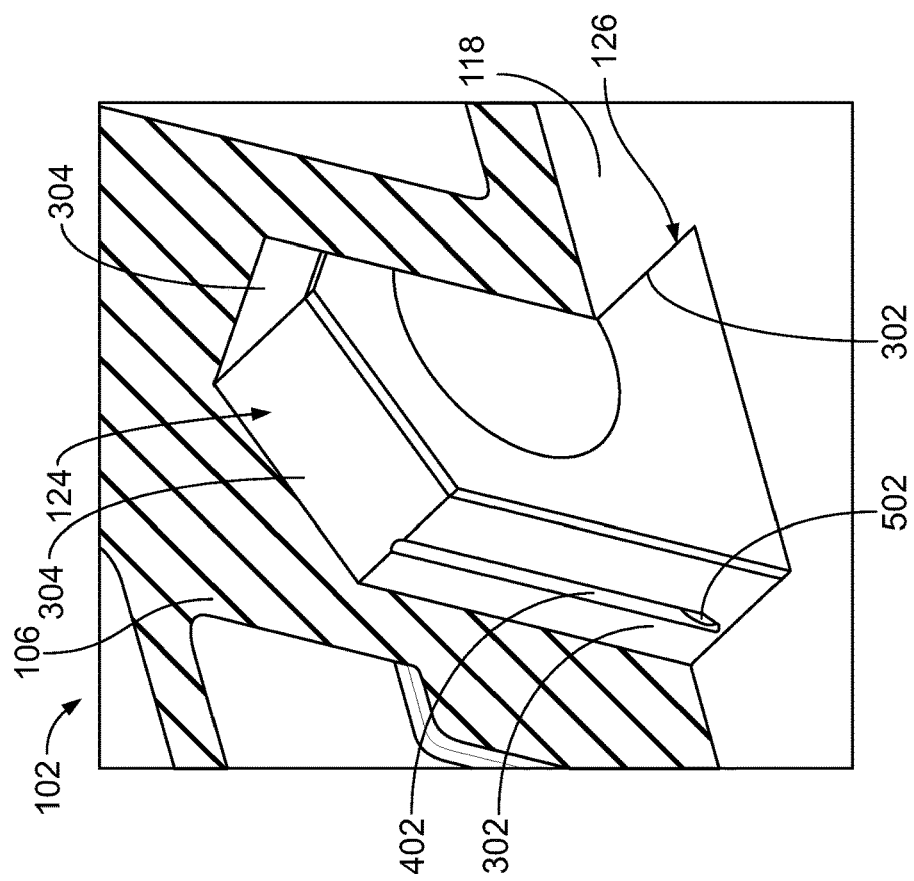
FIG. 5 is a cross-sectional perspective view of a housing of the electrical device according to an embodiment showing one of the nut retention slots.

FIG. 5 is a cross-sectional perspective view of the housing 102 of the electrical device 100 (shown in FIG. 1) according to an embodiment showing one of the nut retention slots 124. There is no nut within the slot 124 in the illustrated embodiment. In the illustrated embodiment, only the crush rib 402 on one of the two side walls 302 is visible, but the non-visible, opposing crush rib 402 has the same properties and characteristics as the illustrated crush rib 402. The crush ribs 402 may extend for a majority of the length of the side walls 302 between the opening 126 at the outer side 118 of the flange 106 and the back walls 304. In the illustrated embodiment, the crush ribs 402 extend substantially the entire length of the side walls 302. The back walls 304 do not include crush ribs. Optionally, the ribs 402 may have a tapered end 502 proximate to the opening 126. The tapered end 502 provides a lead-in section to prevent the crush ribs 402 from stubbing on the perimeter of the nut 122 when the nut 122 is loaded into the nut retention slot 124.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely example embodiments. Many other embodiments and modifications within the spirit and scope of the claims will be apparent to those of ordinary skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical device comprising:
   a housing including a flange, the flange having a top side, an opposite bottom side, and outer side extending between the top side and the bottom side, the flange defining a bolt aperture extending from the bottom side towards the top side, the flange including a nut retention slot within the flange, the nut retention slot having a size and shape configured to receive a nut therein through an opening along the outer side of the flange,
   wherein the bolt aperture is positioned relative to the nut retention slot to align with a threaded central bore of the nut disposed within the nut retention slot to allow insertion of a bolt through the bolt aperture into the threaded central bore of the nut,
   wherein the nut retention slot has a perimeter defined by the opening along the outer side, two opposing side walls that extend from the opening, and a back end across from the opening, the back end being non-planar and defined by multiple back walls that extend between the two side walls,
   wherein each of the side walls includes a respective crush rib protruding from the side wall into the nut retention slot, the crush ribs linearly elongated parallel to one another and perpendicular to a linear orientation of the bolt aperture, each crush rib configured to engage a different one of the exterior sides of the nut that is received within the nut retention slot to retain the nut in the nut retention slot via an interference fit,
   wherein the housing includes a base having a top face and a bottom face, the flange extending outward from the base, the bottom face of the base being flush with the bottom side of the flange, the base including an array of channels extending between the top face and the bottom face, the channels configured to receive one or more of fuse conductors or relay conductors therein, and
   wherein two angled back walls of the nut retention slot lack crush ribs.

2. The electrical device of claim 1, wherein the back end of the nut retention slot across from the opening comprises two back walls that are angled transverse to a plane of the opening.

3. The electrical device of claim 1, wherein the side walls of the nut retention slot extend parallel to each other and perpendicular to a plane of the opening.

4. The electrical device of claim 1, wherein the flange comprises a dielectric material, each crush rib being integral to the respective side wall and deformable.

5. The electrical device of claim 1, wherein the nut retention slot within the flange has a height defined between an upper interior surface and an opposite lower interior surface of the flange, the bolt aperture including a first portion extending between the top side of the flange and the upper interior surface and a second portion extending between the lower interior surface and the bottom side of the flange.

6. The electrical device of claim 1, wherein the nut retention slot within the flange is located between the top side of the flange and the bottom side of the flange, the nut retention slot vertically spaced apart from each of the top side and the bottom side.

7. The electrical device of claim 1, wherein an entirety of the nut within the nut retention slot is disposed within the flange.

8. The electrical device of claim 1, wherein the bolt aperture in the flange has a diameter that is larger than a diameter of the threaded central bore of the nut that is received within the nut retention slot.

9. The electrical device of claim 1, wherein the back end is defined by three back walls that extend between the two side walls, and the nut retention slot has a six-sided perimeter defined by the opening, the two side walls, and the three back walls across from the opening.

10. An electrical device comprising:
    a housing including a flange having a top side and an opposite bottom side, the flange defining a bolt aperture linearly extending from the bottom side towards the top side, the flange including a nut retention slot within the flange, the nut retention slot within the flange having a size and shape configured to receive a nut therein through an opening along an outer side of the flange, the bolt aperture positioned relative to the nut retention slot to align with a threaded central bore of the nut disposed within the nut retention slot to allow insertion of a bolt through the bolt aperture into the threaded central bore of the nut,
    wherein the nut retention slot is defined between two opposing side walls that extend from the opening and each includes a respective crush rib, the crush ribs protruding from the side walls into the nut retention slot, the crush ribs linearly elongated parallel to one another and perpendicular to an orientation of the bolt aperture, the crush ribs configured to engage exterior sides of the nut that is received within the nut retention slot to retain the nut in the nut retention slot via an interference fit,
    wherein the nut retention slot within the flange has a pentagonal perimeter defined by the two opposing side walls, the opening to the nut retention slot along the outer side of the flange, and two angled back walls disposed between the two side walls across from the opening,
    wherein the housing includes a base having a top face and a bottom face, the flange extending outward from the base, the bottom face of the base being flush with the bottom side of the flange, the base including an array of channels extending between the top face and the bottom face, the channels configured to receive one or more of fuse conductors or relay conductors therein, and
    wherein the two angled back walls of the nut retention slot lack crush ribs.

11. The electrical device of claim 10, wherein the two opposing side walls extend parallel to each other from the opening into the flange, the side walls extending perpendicular to a plane of the opening.

12. The electrical device of claim 10, wherein the flange comprises a
    dielectric material, the crush ribs being integral to the side walls and deformable.

13. The electrical device of claim 10, wherein the nut retention slot within the flange has a height defined between an upper interior surface and an opposite lower interior surface of the flange, the nut retention slot being vertically spaced apart from each of the top side and the bottom side.

14. The electrical device of claim 10, wherein each of the two angled back walls is oriented transverse to a plane of the opening.

15. The electrical device of claim 10, wherein the nut that is received within the nut retention slot has a range of outer diameters along a perimeter of the nut between a minimum outer diameter and a maximum outer diameter, the nut retention slot having a width between the two side walls that is greater than the minimum outer diameter of the nut and less than the maximum outer diameter of the nut.

16. An electrical device comprising:
a housing including a flange, the flange having a top side, an opposite bottom side, and outer side extending between the top side and the bottom side, the flange defining a bolt aperture linearly extending from the bottom side towards the top side, the flange including a nut retention slot within the flange that is aligned with the bolt aperture, the nut retention slot extending from an opening along the outer side and defined between two opposing side walls that each extends from the opening, each of the side walls including a respective crush rib protruding from the corresponding side wall into the nut retention slot, the crush ribs linearly elongated parallel to one another and perpendicular to an orientation of the bolt aperture, wherein the nut retention slot has a perimeter defined by the opening, the two side walls, and a back end across from the opening, the back end being non-planar and defined by multiple back walls that extend between the two side walls; and
a nut received within the nut retention slot through the opening in the outer side of the flange, the nut retained within the nut retention slot via an interference fit between the crush ribs and exterior sides of the nut, the nut including a threaded central bore that aligns with the bolt aperture to allow insertion of a bolt through the bolt aperture into the threaded central bore of the nut,
wherein the nut has a range of outer diameters along a perimeter of the nut between a minimum outer diameter and a maximum outer diameter, the nut retention slot having a width between the two side walls that is greater than the minimum outer diameter of the nut and less than the maximum outer diameter of the nut,
wherein the housing includes a base having a top face and a bottom face, the flange extending outward from the base, the bottom face of the base being flush with the bottom side of the flange, the base including an array of channels extending between the top face and the bottom face, the channels configured to receive one or more of fuse conductors or relay conductors therein, and
wherein the two angled back walls of the nut retention slot lack crush ribs.

17. The electrical device of claim 16, wherein the nut retention slot within the flange has a height defined between an upper interior surface and an opposite lower interior surface of the flange, the nut retention slot being vertically spaced apart from each of the top side and the bottom side.

18. The electrical device of claim 16, wherein the side walls of the nut retention slot extend parallel to each other and perpendicular to a plane of the opening along the outer side.

* * * * *